(12) United States Patent
Nguyen et al.

(10) Patent No.: US 9,537,508 B1
(45) Date of Patent: Jan. 3, 2017

(54) SYSTEMS AND METHODS FOR DECODING CASCADE LDPC CODES

(71) Applicant: Marvell International Ltd., Hamilton (BM)

(72) Inventors: Dung Viet Nguyen, San Jose, CA (US); Nedeljko Varnica, San Jose, CA (US); Shashi Kiran Chilappagari, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 72 days.

(21) Appl. No.: 14/590,718

(22) Filed: Jan. 6, 2015

Related U.S. Application Data

(60) Provisional application No. 61/925,342, filed on Jan. 9, 2014.

(51) Int. Cl.
  *H03M 13/00* (2006.01)
  *H03M 13/11* (2006.01)
(52) U.S. Cl.
  CPC ............................... *H03M 13/1105* (2013.01)
(58) Field of Classification Search
  CPC .................................................. H03M 13/1105
  See application file for complete search history.

(56) References Cited

U.S. PATENT DOCUMENTS

| | | | |
|---|---|---|---|
| 9,048,871 B2 | 6/2015 | Varnica et al. | |
| 2005/0283708 A1* | 12/2005 | Kyung | H03M 13/1111 714/758 |
| 2012/0185744 A1 | 7/2012 | Varnica et al. | |
| 2013/0283131 A1* | 10/2013 | Tsatsaragkos | H03M 13/13 714/776 |
| 2014/0229806 A1* | 8/2014 | Li | H03M 13/2975 714/785 |

* cited by examiner

*Primary Examiner* — Sam Rizk

(57) ABSTRACT

Systems and methods are provided for decoding a codeword of a low density parity check (LDPC) code. The systems and methods may include receiving a vector corresponding to the codeword encoded with a parity check matrix, and processing a first portion of the received vector with a first portion of the parity check matrix to obtain a decoding estimate of a first portion of the codeword. The systems and methods may further include processing the decoding estimate of the first portion of the codeword with a second portion of the parity check matrix to obtain an intermediate vector, and processing a second portion of the received vector with a third portion of the parity check matrix and the intermediate vector to obtain a decoding estimate of a second portion of the codeword.

20 Claims, 8 Drawing Sheets

SYSTEMS AND METHODS FOR DECODING CASCADE LDPC CODES

CROSS REFERENCE TO RELATED APPLICATION

This disclosure claims the benefit under 35 U.S.C. §119 (e) of U.S. Provisional Application No. 61/925,342, filed on Jan. 9, 2014, which is hereby incorporated by reference herein in its entirety.

FIELD OF USE

The present disclosure relates generally to error correcting systems and methods and, more particularly, to cascade low density parity check (LDPC) codes.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

This disclosure relates generally to data decoding, and more particularly to decoding techniques that support the successive decoding of LDPC codewords having a codeword length greater than the maximum codeword length supported by a decoder in a single iteration. In some aspects, a class of LDPC codes for which such successive decoding can be supported may be referred to as cascade LDPC codes.

LDPC codes have become an important component of some error correcting systems. LDPC codes may employ several different kinds of parity check matrices. For example, the structure of an LDPC code's parity check matrix may be random, cyclic, or quasi-cyclic. LDPC codes defined by quasi-cyclic parity check matrices are particularly common and computationally efficient. These codes are known as quasi-cyclic low density parity check (QC-LDPC) codes.

The structure of an LDPC code's parity check matrix may determine what types of decoding algorithms may be used with that LDPC code. For example, for QC-LDPC codes, layered decoding techniques may be used, which exploit the fact that a QC-LDPC code's parity check matrix consists of circular submatrices or so-called "circulants." The size of these circulants corresponds to the number of check node processors necessary to implement layered decoding and determines to what extent the processing of the parity check matrix can be parallelized. For example, a parity check matrix composed of circulants of size $S_c$ can be implemented using $S_c$ check node processors.

As used herein, the term "message" refers to a numerical value, usually representing a log likelihood ratio (LLR). An LDPC decoder may decode LDPC codes using an iterative message-passing algorithm, such as a min-sum decoding algorithm, or any other iterative algorithm, such as a bit-flipping algorithm. Iterative algorithms of this type may decode a received codeword using an iterative process in which each iteration includes two update steps involving check nodes and variable nodes.

SUMMARY OF THE DISCLOSURE

In accordance with an embodiment of the present disclosure, a method is provided for decoding a codeword of a low density parity check (LDPC) code. The method includes receiving a vector corresponding to the codeword encoded with a parity check matrix, and processing a first portion of the received vector with a first portion of the parity check matrix to obtain a decoding estimate of a first portion of the codeword. The method further includes processing the decoding estimate of the first portion of the codeword with a second portion of the parity check matrix to obtain an intermediate vector, and processing a second portion of the received vector with a third portion of the parity check matrix and the intermediate vector to obtain a decoding estimate of a second portion of the codeword.

In some implementations, the parity check matrix may have lower triangular block structure.

In some implementations, the parity check matrix may include a plurality of circulants.

In some implementations, the first portion of the parity check matrix may satisfy a first set of constraints, and the second portion of the parity check matrix may satisfy a second set of constraints.

In some implementations, the method may further include combining the decoding estimate of the first portion of the codeword with the decoding estimate of the second portion of the codeword to obtain a decoding estimate of the codeword.

In accordance with an embodiment of the present disclosure, a system is provided for decoding a codeword of a low density parity check (LDPC) code. The system may include a decoding buffer configured to receive a vector corresponding to the codeword encoded with a parity check matrix. The system may further include control circuitry configured to process a first portion of the received vector with a first portion of the parity check matrix to obtain a decoding estimate of a first portion of the codeword. The control circuitry may be further configured to process the decoding estimate of the first portion of the codeword with a second portion of the parity check matrix to obtain an intermediate vector, and process a second portion of the received vector with a third portion of the parity check matrix and the intermediate vector to obtain a decoding estimate of a second portion of the codeword.

In some implementations, the parity check matrix may have a lower triangular block structure.

In some implementations, the parity check matrix may include a plurality of circulants.

In some implementations, the first portion of the parity check matrix may satisfy a first set of constraints, and the second portion of the parity check matrix may satisfy a second set of constraints.

In some implementations, the control circuitry may further be configured to combine the decoding estimate of the first portion of the codeword with the decoding estimate of the second portion of the codeword to obtain a decoding estimate of the codeword.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

Systems and methods are provided for decoding codewords associated with cascade low density parity check (LDPC) codes. In applications or devices where information may be altered by interference signals or other phenomena, error-correction codes, such as LDPC codes, may provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
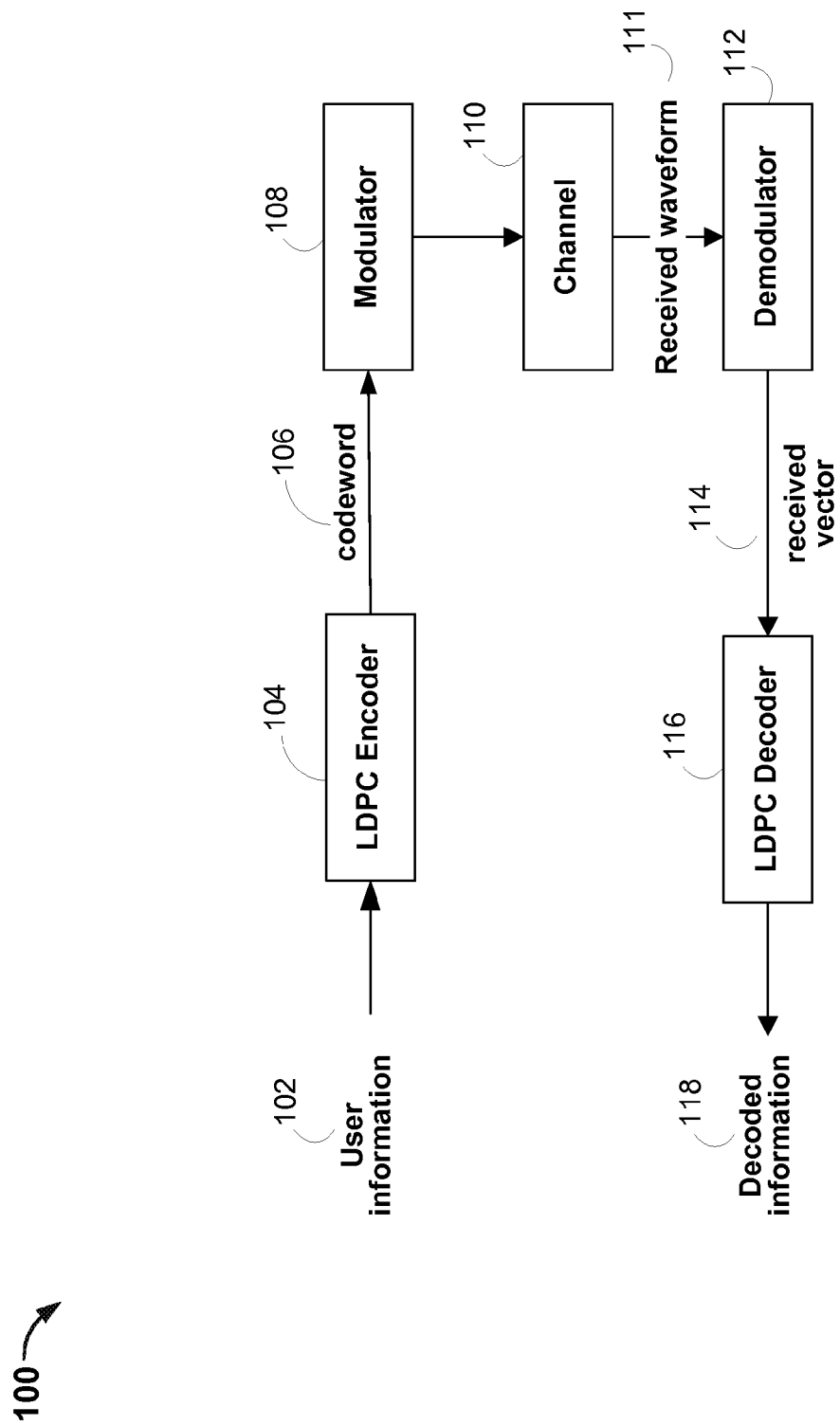
FIG. 1 shows an illustrative communication or data storage system that utilizes error-correction codes for achieving reliable communication or storage in accordance with some embodiments of the present disclosure.

FIG. 1 shows an illustrative communication or data storage system 100 that utilizes error-correction codes for achieving reliable communication or storage in accordance with some embodiments of the present disclosure. User information 102 is encoded through encoder 104. User information 102, often referred to as the message information or a message vector, may be grouped into units of k symbols, where each symbol may be binary, ternary, quaternary, or any other suitable type of data. However, for simplicity, embodiments of the present invention will be described in terms of binary bits. In the process of encoding user information 102, different codes may be used by encoder 104 to achieve different results.

As shown in FIG. 1, encoder 104 may encode user information 102 using a low density parity check (LDPC) code. The result of encoding user information 102 is codeword 106, also denoted as c. Codeword 106 may be of a predetermined length, which may be referred to as n, where n≥k.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 may then be processed by LDPC decoder 116. LDPC decoder 116 may be used to correct or detect errors in received vector 114. LDPC decoder 116 may use a circular shifter. A circular shifter may be used by LDPC decoder 116 to decode a quasi-cyclic LDPC code. LDPC decoder 116 may also use an iterative message-passing algorithm or layered decoding to correct or detect errors in received vector 114. LDPC decoder 116 may calculate a log-likelihood-ratio (LLR) message (also known as soft information). For example, LDPC decoder 116 may compute a LLR message using the equation $$LLR(b_i) = \log \frac{P(b_i = 0)}{P(b_i = 1)} \qquad \text{Eq. (1)}$$

for each i, where $b_i$ may represent the i-th bit in received vector 114. LDPC decoder 116 may use the computed LLR messages in the message passing algorithm or in layered decoding. When utilizing such an iterative algorithm, LDPC decoder 116 may perform several iterations of the algorithm until the output of LDPC decoder 116 converges to a valid codeword. In some instances, the output of LDPC decoder 116 may fail to converge to a valid codeword. Decoder failure may be caused by a variety of reasons. Because the output of LDPC decoder 116 may never converge to a valid codeword in certain situations, LDPC decoder 116 may be equipped with a maximum iteration limit, which may be any suitable predetermined number. When LDPC decoder 116 reaches the maximum iteration limit, LDPC decoder 116 may automatically terminate operation and move on to the next received vector 114. However, if the output of LDPC decoder 116 successfully converges to a valid iterative codeword, LDPC decoder 116 may then output decoded information 118.

The LDPC codes processed by encoder 104 of FIG. 1 and LDPC decoder 116 of FIG. 1 are conventionally represented by mathematical vector models. In particular, an LDPC code may be described by its parity check matrix H. Parity check matrix H may be of size m×n, corresponding to codewords of length n and syndromes of length m. Codewords may be, for example, n-length codeword 106 or n-length received vector 114 of FIG. 1. Syndrome length m may satisfy the inequality m≥n−k and where k is the length of the information being encoded (e.g., the length of user information 102 of FIG. 1). When parity check matrix H is multiplied by codeword c, the result is an all zero-vector, which is a vector of size m×1 where all elements equal zero, i.e., $$Hc^T=0.$$
Eq. (2)

Parity check matrix H has a maximum column weight defined to be the maximum of the set of the number of nonzero entries in each column of parity check matrix H. Parity check matrix H is not unique, and may be chosen, for example, to be computationally convenient and/or to decrease the number of errors generated by the message passing algorithm in LDPC decoder 116. As discussed in relation to FIG. 1, codeword c may be decoded in LDPC decoder 116 to produce decoded information 118.

In some aspects, the complexity of an LDPC decoder may depend on the codeword length that it is designed to process. Generally, the complexity of the decoder increases with the codeword length, for example, in a linear manner. In some implementations, a decoder may be characterized by the maximum codeword length $n_s$ that it is able to decode concurrently.

In some embodiments, for a specific class of LDPC codes, a decoder that supports the concurrent decoding of a codeword with codeword length up to $n_s$ may be used to decode codewords with a codeword length greater than $n_s$ by decoding portions of the codeword one after another. As long as each of the portions of the codeword has a length below $n_s$, the codeword may thus be decoded in a sequential or iterative fashion. The class of LDPC codes that supports this operation may possess a specific structure of the parity check matrix, that consists of block matrices of appropriate sizes. In some aspects, this class of LDPC codes may be referred to as cascade LDPC codes.

Figure 2:
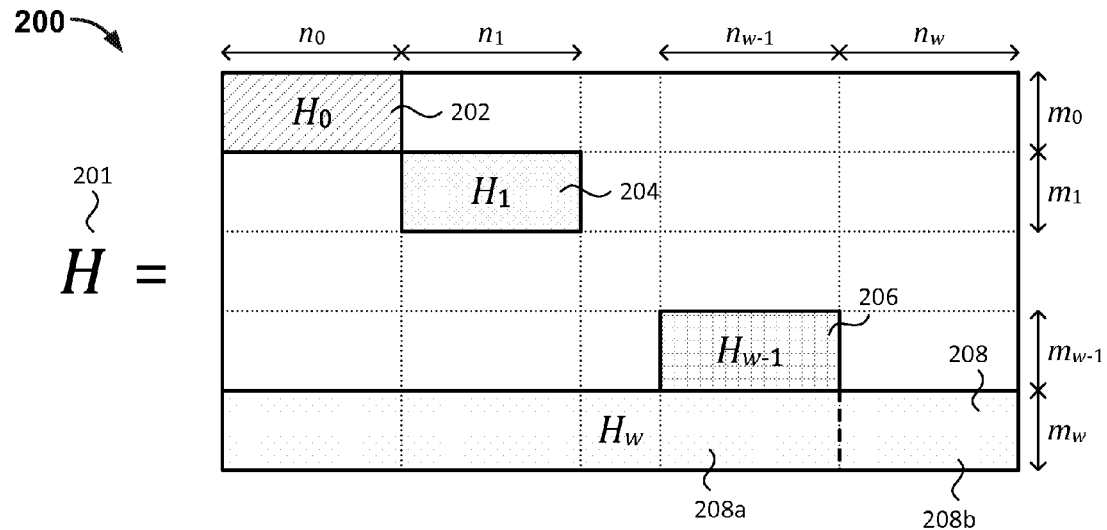
FIG. 2 shows the structure of a parity check matrix associated with a Type A cascade LDPC code, in accordance with some embodiments of the present disclosure.

FIG. 2 shows the structure of a parity check matrix 201 associated with a Type A cascade LDPC code, in accordance with some embodiments of the present disclosure. Parity check matrix 201 may include a number of block matrices, such as block matrices $H_0$ (element 202), $H_1$ (element 204), $H_{w-1}$ (element 206), and $H_w$ (element 208), where w denotes the total number of block matrices. Elements of parity check matrix H (element 201) that do not belong to any of block matrices 202-208 may be equal to zero. Each of block matrices 202-208 may be composed of non-zero and zero elements. For example, for binary LDPC codes block matrices 202-208 may be composed of entries that are either logical one or logical zero.

Block matrices 202-208 may have different sizes. For example, block matrix $H_0$ (element 202) may have size $m_0 \times n_0$, block matrix $H_1$ (element 204) may have size $m_1 \times n_1$, and block matrix $H_{w-1}$ (element 206) may have size $m_{w-1} \times n_{w-1}$. Among block matrices 202-206, no two matrices may span the same columns. In contrast to block matrices 202-206, block matrix $H_w$ (element 208) may span all columns of parity check matrix H (element 201). The number of rows of block matrix $H_w$ (element 208) may be equal to $n_w$. Accordingly, parity check matrix H (element 201) may have size m×n, where $m=m_0+m_1+\ldots+m_w$ and $n=n_0+n_1+\ldots+n_w$. In some implementations, the parameters $m_0, m_1, \ldots, m_{w-1}, m_w$ may be chosen to be equal, and the parameters $n_0, n_1, \ldots, n_{w-1}, n_w$ may be chosen to be equal.

Parity check matrix 201 may be expressed as a lower block triangular matrix with block matrices 202-206 on its main diagonal. Block matrix 208 ($H_w$) may be split into two block matrices 208a and 208b, wherein block matrix 208b may correspond to the last block matrix in the lower block triangular structure of parity check matrix 201. Parity check matrix 201 may possess block triangular structure, because once parity check matrix 201 is written as a block matrix, the blocks of parity check matrix 201 may satisfy the triangular constraint.

Figure 3:
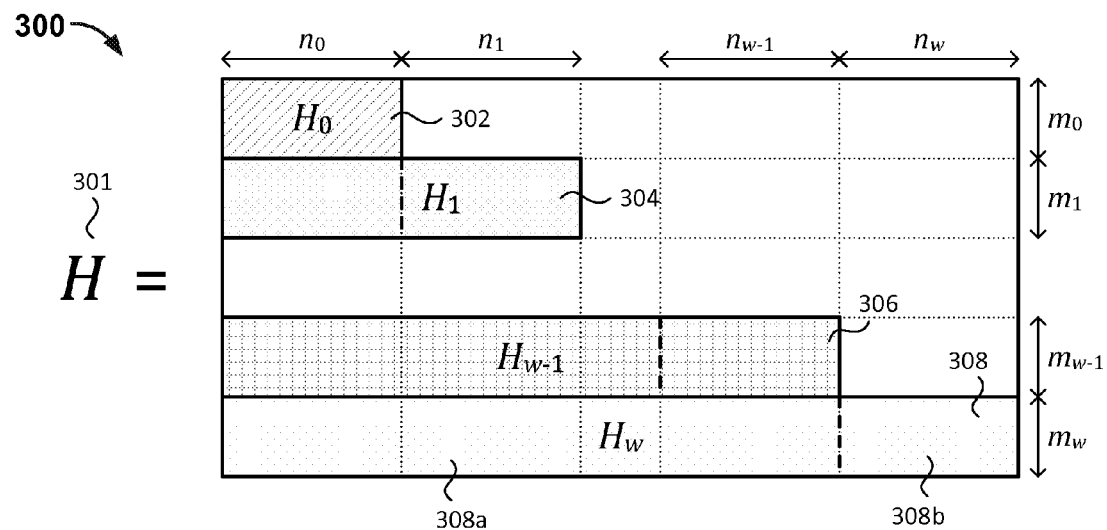
FIG. 3 shows the structure of a parity check matrix associated with a Type B cascade LDPC code, in accordance with some embodiments of the present disclosure.

FIG. 3 shows the structure of a parity check matrix 301 associated with a Type B cascade LDPC code, in accordance with some embodiments of the present disclosure. Similar to parity check matrix 201 discussed in relation to FIG. 2, parity check matrix 301 may include a number of block matrices 302, 304, 306, and 308. However, in contrast to block matrices 202-206, some of block matrices 302-306 may occupy some of the same columns. For example, block matrix 302 ($H_0$) may have size $m_0 \times n_0$, block matrix 304 may have size $m_1 \times (n_0+n_1)$, block matrix 306 may have size $m_{w-1} \times (n_0+n_1+\ldots+n_{w-1})$, and block matrix 208 may have size $m_w \times (n_0+n_1+\ldots+n_{w-1}+n_w)$. Despite the differently-sized block matrices 302-308, parity check matrix 301 may be a lower block triangular matrix, as is shown in FIG. 3 by partitioning each of block matrices 304, 306, and 308 into a first portion and a second portion.

Figure 4:
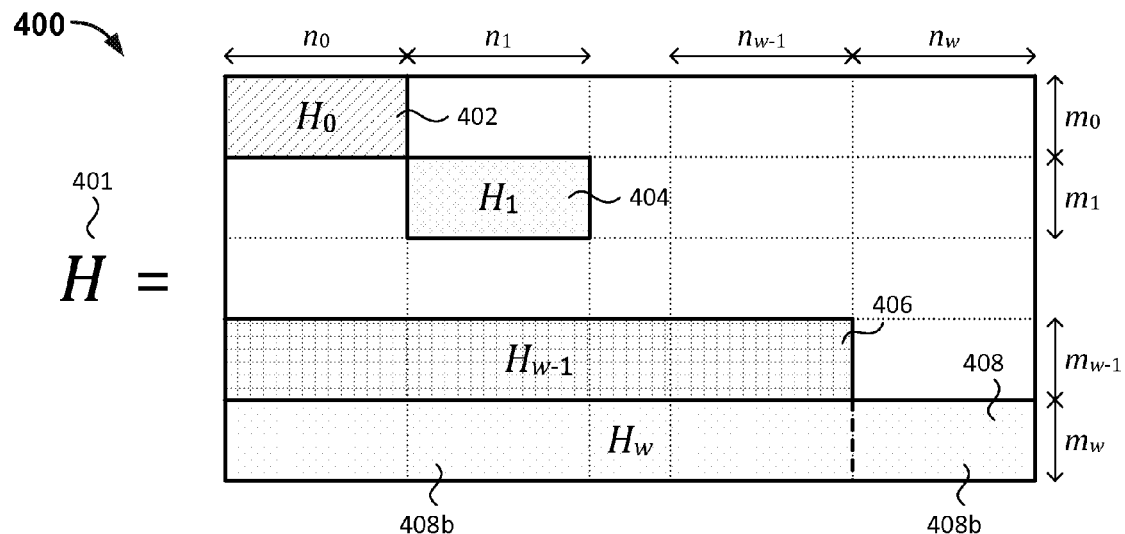
FIG. 4 shows the structure of a parity check matrix associated with a Type C cascade LDPC code, in accordance with some embodiments of the present disclosure.

FIG. 4 shows the structure of a parity check matrix 401 associated with a Type C cascade LDPC code, in accordance with some embodiments of the present disclosure. In some aspects, the structure of parity check matrix 401 may be a mixture between parity check matrix 201 (i.e., the parity check matrix of a Type A cascade LDPC code) and parity check matrix 301 (i.e., the parity check matrix of a Type B cascade LDPC code). Similar to parity check matrices 201 and 301, parity check matrix 401 may include a number of block matrices 402-408. In some implementations, the size of some of block matrices 402-408 may be consistent with a Type A cascade LDPC code, whereas others may be consistent with a Type B cascade LDPC code. For example, the size of block matrix 404 may be consistent with a Type A cascade LDPC code, because the size of block matrix 404 may be equal to $m_1 \times n_1$, while the size of block matrix 406 may be consistent with a Type B cascade LDPC code, because the size of block matrix 406 is equal to $m_2 \times (n_0+n_1+n_2)$. In other words, the parity check matrices of Type A and Type B cascade LDPC codes may differ with respect to the positions of their respective block matrices. The parity check matrix of a Type C cascade LDPC code may be a "mixture" of the parity check matrices of Type A and B cascade LDPC codes because its parity check matrix may have some blocks that span the same columns and some blocks that do not span the same columns.

Figure 5:
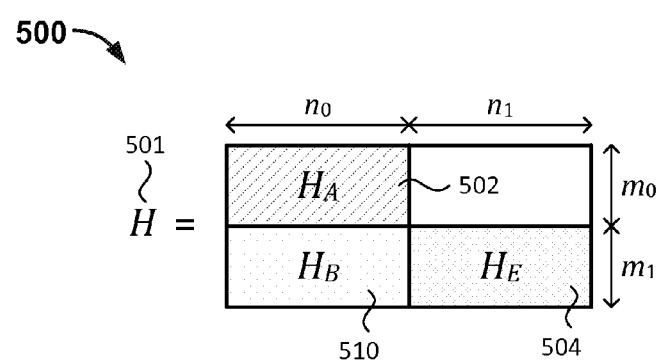
FIG. 5 shows a simplified structure of a parity check matrix to illustrate a decoding process suitable for decoding cascade LDPC codes, in accordance with some embodiments of the present disclosure.

FIG. 5 shows an exemplary structure of a parity check matrix 501 to illustrate a decoding process suitable for decoding cascade LDPC codes, in accordance with some embodiments of the present disclosure. In some aspects, parity check matrix 501 may correspond to the parity check matrix of a Type B cascade LDPC code. Similar to parity check matrices 201, 301, and 401, parity check matrix 501 may include a number of block matrices, such as block matrix $H_A$ (element 502), block matrix $H_E$ (element 504), and block matrix $H_B$ (element 510). Block matrix 502 may have size $m_0 \times n_0$, block matrix 504 may have size $m_1 \times n_1$, and block matrix 510 may have size $m_1 \times n_0$.

In some embodiments, parity check matrix 501 may be used as a building block to construct any one of parity check matrix 201, parity check matrix 301, and parity check matrix 401. For example, block matrix 502 may correspond to the first $n_0+n_1+\ldots+n_{w-1}$ columns and $m_0+m_1+\ldots+m_{w-1}$ rows of parity check matrix 201, block matrix 504 may correspond to block matrix 208b, and block matrix 510 may correspond to block matrix 208a. Similarly, block matrix 502 may correspond to the first $n_0+n_1+\ldots+n_{w-1}$ columns and $m_0+m_1+\ldots+m_{w-1}$ rows of parity check matrix 301 or 401, block matrix 504 may correspond to block matrix 308b or 408b, and block matrix 510 may correspond to block matrix 308a or 408a.

In the following, systems and methods for decoding cascade LDPC codes will be described with reference to parity check matrix 501. However, it is understood that the disclosed systems and methods may similarly be applied to parity check matrices 201, 301, and 401 without departing from the scope of the present disclosure.

Codewords belonging to an LDPC code are defined based on parity check equation (2). Accordingly, a codeword $c=[c_{AB}, c_E]$ of an LDPC code defined by parity check matrix 501 needs to satisfy the equations $$H_A c_{AB}^T = 0, \quad \text{Eq. (3)}$$

$$[H_B H_E][C_{AB} C_E]^T = 0, \quad \text{Eq. (4)}$$

$$\begin{bmatrix} H_A \\ H_B \end{bmatrix} c_{AB}^T = \begin{bmatrix} 0 \\ H_E c_E^T \end{bmatrix}, \quad \text{Eq. (5)}$$

where 0 denotes a vector with all zero elements of appropriate size (e.g., $m_0 \times 1$ for equations (3) and (5), and $m_1 \times 1$ for equation (4)). Equations (3)-(5) may result from substituting the block structure of parity check matrix 501 into parity check equation (2). Equation (4) may be rewritten as $H_E c_E^T = H_B c_{AB}^T$ by expanding the matrix multiplication of equation (4).

In some embodiments, if a decoder is able to decode codewords with a maximum codeword length that exceeds $n_0+n_1$, then codeword c may be decoded by processing parity check matrix 501 without taking into account its block structure. However, due to the specific structure of party check matrix 501, a decoder that is able to decode codewords with maximum codeword length of only $n_s$, where $n_s$ satisfies $n_0$, $n_1 < n_s < n_0 + n_1$, may also be used to decode codeword c using an iterative decoding procedure. In particular, a received vector y may first be partitioned into two segments. The first segment $y_{AB}$ may correspond to the first $n_0$ elements of codeword c and the second segment $y_E$ may correspond to the last $n_1$ elements of codeword c, i.e., $y=[Y_{AB} \; Y_E]$. The iterative decoding procedure may seek to find estimates $x_{AB}$ and $x_E$ that resemble the actual symbols of the codeword (denoted as $C_{AB}$ and $C_E$) as closely as possible.

In a first step, the iterative decoding procedure may find an estimate $x_{AB}$ of $c_{AB}$ (i.e., the first portion of the codeword) that satisfies $H_A x_{AB}^T = 0$ (i.e., a decoding estimate that satisfies parity check equation (3)). Various types of LDPC decoding schemes may be used for this purpose, because parity check equation (3) itself may be viewed as defining an LDPC code in relation to the first portion of the codeword. If a decoding estimate $x_{AB}$ that satisfies $H_A x_{AB}^T = 0$ cannot be found for some reason (e.g., because of too much corruption contained in the received codeword), a decoding failure may be declared.

In a second step, the iterative decoding procedure may determine an estimate $x_E$ of $c_E$ that satisfies $H_E x_E^T = H_B x_{AB}^T$ (i.e., parity check equation (4)). In some aspects, the iterative decoding procedure may first compute the matrix product $H_B x_{AB}^T$ based on the result obtained in the first step of the iterative decoding procedure and $H_B$ (i.e., block matrix 510). Similar to the first step, the decoding procedure may again use various types of decoding algorithms to obtain the estimate $x_E$. For example, coset decoding schemes may be used to obtain the estimate $x_E$.

If the estimate $x_{AB}$ of the first portion of codeword c is obtained correctly in the first step of the decoding procedure, then $x_{AB} = c_{AB}$ and $H_B x_{AB}^T = H_B c_{AB}^T$. Therefore, a decoding estimate of the entire received codeword may be obtained by combining the estimates obtained in the first step and the second step to yield $x=[x_{AB} \; x_E]$.

In some embodiments, if an estimate of the first portion of the codeword $x_{AB}$ that satisfies $H_A x_{AB}^T = 0$ cannot be found, the decoding algorithm may declare an error and decoding may be halted. However, in other embodiments, more complex decoding schemes may be used in order to obtain an estimate $x_{AB}$ of $y_{AB}$ even in such situations. In particular, because the decoding algorithm may not be able to determine an estimate $x_{AB}$ that satisfies $H_{AB} x_{AB}^T = 0$, the decoding algorithm may find instead an estimate $x_{AB}^{(0)}$ that satisfies $$H_A (x_{AB}^{(0)})^T = r_A^{(0)},$$

where $r_A^{(0)}$ is a vector with at least one non-zero element, and the superscript "(0)" indicates that this is a first estimate of $x_{AB}$ in an iterative procedure.

Even though the estimate $x_{AB}^{(0)}$ may not satisfy parity check equation (3) (i.e., $H_A x_{AB}^{(0)} = 0$), the decoding algorithm may still perform the second step of the decoding procedure by finding an estimate $x_E^{(0)}$ that satisfies $$H_E (x_E^{(0)})^T = H_B (x_{AB}^{(0)})^T.$$

Because residual errors are present in $x_{AB}^{(0)}$ when $r_A^{(0)}$ contains at least one non-zero element, the estimate $x_E^{(0)}$ may not necessarily satisfy the equation $$H_E (x_E^{(0)})^T = H_B (x_{AB}^{(0)})^T.$$

However, without loss of generality, it may be assumed that $x_E^{(0)}$ satisfies $$H_E (x_E^{(0)})^T = H_B (x_{AB}^{(0)})^T + r_B^{(0)},$$

where $r_B^{(0)}$ is a vector that represents the residual error. Based on the estimate $x_E^{(0)}$, the decoding algorithm may then find a refined estimate $x_{AB}^{(1)}$ that satisfies $$\begin{bmatrix} H_A \\ H_B \end{bmatrix} (x_{AB}^{(1)})^T = \begin{bmatrix} 0 \\ H_E(x_E^{(0)})^T \end{bmatrix} = \begin{bmatrix} 0 \\ H_B(x_{AB}^{(0)})^T + r_B^{(0)} \end{bmatrix}.$$

In some aspects, the process of computing estimates $x_{AB}^{(i)}$ and $x_E^{(i)}$ may be repeated for a number of times, either until an estimate $x_{AB}^{(i)}$ is found that satisfies $H_A x_{AB}^{(i)} = 0$ or until a stopping criterion is met. For example, the stopping criterion may specify that a predetermined number of iterations should not be exceeded. The stopping criterion may differ among iterations. For example, if the stopping criterion specifies that decoding is halted if an amount of residual error (e.g., predicted based on intermediate decoding parameters such as the syndrome weight) is below a given threshold, the value of that threshold may depend on the iteration index (e.g., the threshold value may initially be loose but then tightened as the iterative procedure progresses).

Figure 6:
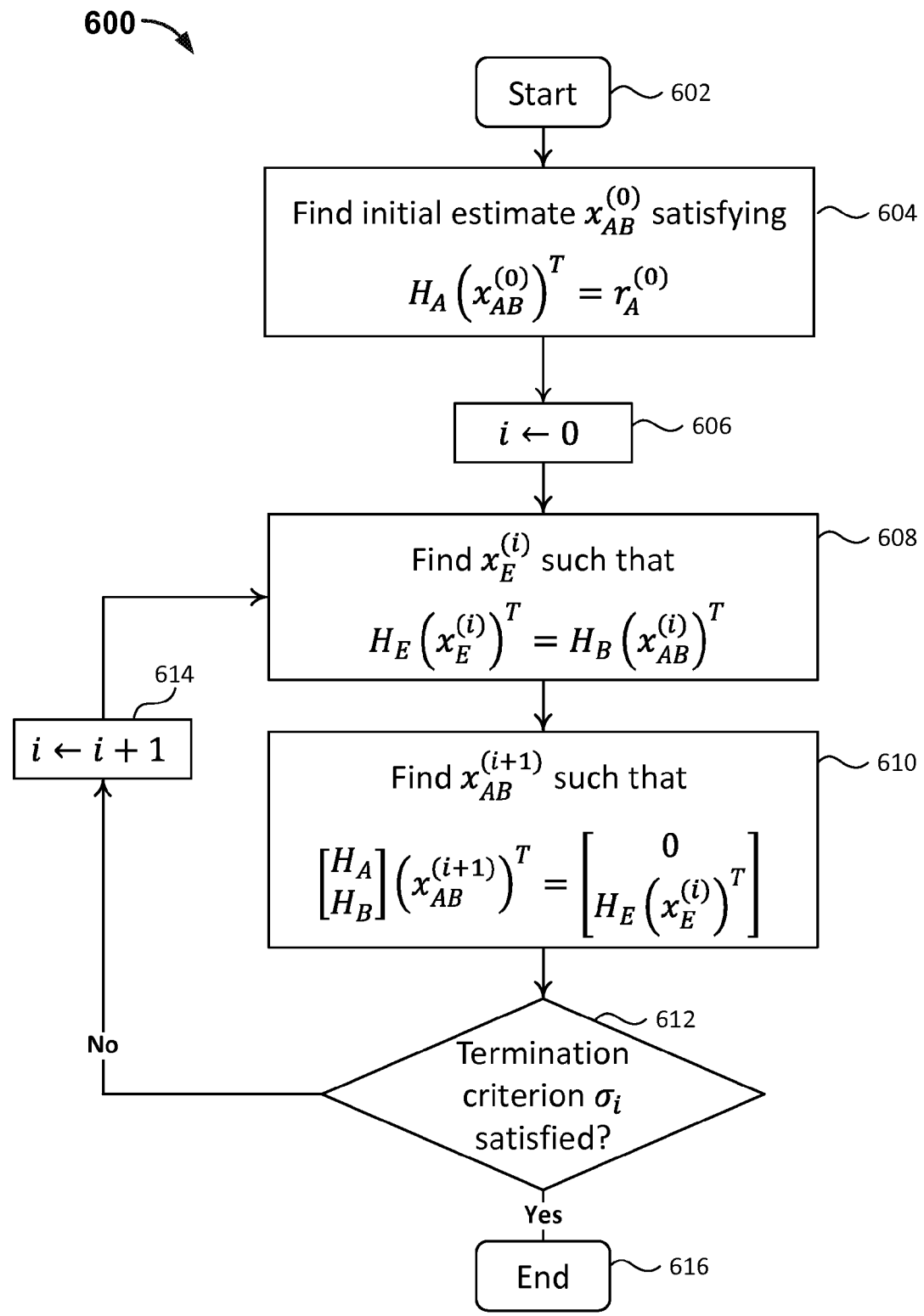
FIG. 6 shows a flow chart illustrating a decoding process for decoding cascade LDPC codes, in accordance with some embodiments of the present disclosure.

FIG. 6 shows a flow chart illustrating a decoding process 600 for decoding cascade LDPC codes, in accordance with some embodiments of the present disclosure. Decoding process 600 may start at 602 by receiving a vector y corresponding to a codeword encoded with a cascade LDPC code. Decoding process 600 may partition the vector into a first portion $y_{AB}$ and a second portion $y_E$ in accordance with the dimensions of the parity check matrix of the cascade LDPC code (e.g., parity check matrix 501). The objective of decoding process 600 may be to find an estimate $x=[x_{AB}, x_E]$ of the actually transmitted codeword $c=[c_{AB}, c_E]$ based on the received vector $y=[y_{AB}, y_E]$. To obtain the decoding estimate x, decoding process 600 may at 604 find an initial estimate $x_{AB}^{(0)}$ of a first portion of the transmitted codeword (i.e., the portion corresponding to $y_{AB}$), such that equation (3) is satisfied. In some implementations, decoding process 600 may use LDPC decoding techniques, coset decoding techniques, or any other suitable decoding technique to obtain the estimate. Once the initial estimate $x_{AB}^{(1)}$ is obtained, decoding process 600 may initialize an iterative decoding procedure at 606 by setting an iteration value i to zero.

At 608, decoding process 600 may find an estimate $x_E^{(i)}$ of the second portion of the transmitted codeword (i.e., the portion corresponding to $y_E$). Similar to process 604, decoding process 600 may use various kinds of decoding schemes to obtain the estimate $x_E^{(i)}$, such as LDPC decoding techniques or coset decoding techniques. In some aspects, decoding process 608 may be referred to as Stage A of the decoding process. The decoding estimate $x_E^{(i)}$ may be stored in a decoding memory or on some other form of storage medium in order to be accessible later in the iterative decoding process.

At 610, decoding process 600 may find an estimate $x_{AB}^{(i+1)}$ such that $$\begin{bmatrix} H_A \\ H_B \end{bmatrix} (x_{AB}^{(i+1)})^T = \begin{bmatrix} 0 \\ H_E(x_E^{(i)})^T \end{bmatrix}$$

is satisfied. As shown in the equation above, decoding process 600 may use the decoding estimate $x_E^{(i)}$ of the second portion of the codeword, obtained in the previous iteration, to obtain the estimate $x_{AB}^{(i+1)}$. For example, decoding estimate $x_E^{(i)}$ may be stored in a decoding memory, a buffer, or a similar storage medium in order to be retrieved at 610. Any suitable type of decoding scheme, including LDPC decoding schemes and coset decoding schemes, may be used to obtain estimate $x_{AB}^{(i+1)}$.

At 612, decoding process 600 may determine whether a termination criterion $\sigma_i$ has been satisfied. The index i represents that termination criterion $\sigma_i$ may depend on an index of the current iteration. For example, in some embodiments, the termination criterion may relate to an estimate of the amount of residual error that is present in the decoding estimate, such as by using a syndrome weight. For instance, the termination criterion may be satisfied if a syndrome weight is above or below a predefined threshold.

In some implementations, if termination criterion $\sigma_i$ is satisfied, decoding process 600 may terminate at 616 and the current decoding estimates $x_{AB}^{(i+1)}$ and $x_E^{(i)}$ may be used as the final decoding estimate x of transmitted codeword c. Conversely, if termination criterion $\sigma_i$ is not satisfied, decoding process 600 may continue at 614 by increasing the iteration counter by one and resuming at step 608 with Stage A of the decoding procedure.

In some embodiments, decoder implementations for Type A and Type B cascade LDPC codes may differ in terms of the amount of parallel processing that can be supported. For example, with reference to parity check matrices 201 and 301, discussed in relation to FIGS. 2 and 3, a received vector may be partitioned into segments in accordance with the size of block matrices 202-208 and 302-308, respectively. For instance, a transmitted codeword c may be partitioned according to $$c = [c_0, c_1, \ldots, c_{w-1}, c_w],$$

where $c_i$ has is a vector of length $n_i$. For a Type A cascade LDPC code defined by parity check matrix 201, the decoder may independently and in parallel find an estimate $x_0$ for $c_0$, an estimate $x_1$ for $c_1$, and an estimate $x_{w-1}$ for $c_{w-1}$ because $H_0$ (i.e., block matrix 202), $H_1$ (i.e., block matrix 204), and $H_{w-1}$ (i.e., block matrix 206) occupy different columns of parity check matrix 201. In contrast, such parallel processing may not be possible for Type B cascade LDPC codes because $H_0$ (i.e., block matrix 302), $H_1$ (i.e., block matrix 304), and $H_{w-1}$ (i.e., block matrix 306) all occupy a common set of columns (i.e., the first $n_0$ columns). Accordingly, for a Type B cascade LDPC code it may be necessary to first decode $c_0$ and $c_1$ using the iterative decoding procedure described in relation to FIG. 6, and then used the obtained estimates of $x_1$ and $x_2$ to decode the remaining portions of the transmitted codeword.

As discussed in relation to FIGS. 2-4, cascade LDPC codes may be categorized into Type A, Type B, and Type C cascade LDPC codes. In addition, in some embodiments, these cascade LDPC codes may be associated with other encoding properties or constraints. For example, cascade LDPC codes may be associated with encoder constraints, constraints on the number of cycles or loops in a graph representation of a matrix (e.g., relating to the girth of the parity check matrix), constraints on the column-weight and row-weight distributions of the matrix, and structural constraints (e.g., structures that are desirable from an implementation perspective, such as quasi-cyclic structures). The aforementioned constraints may be combined with the constraints that cascade LDPC codes impose on the parity check matrix (e.g., the structural constraints of parity check matrices 201, 301, and 401).

Figure 7:
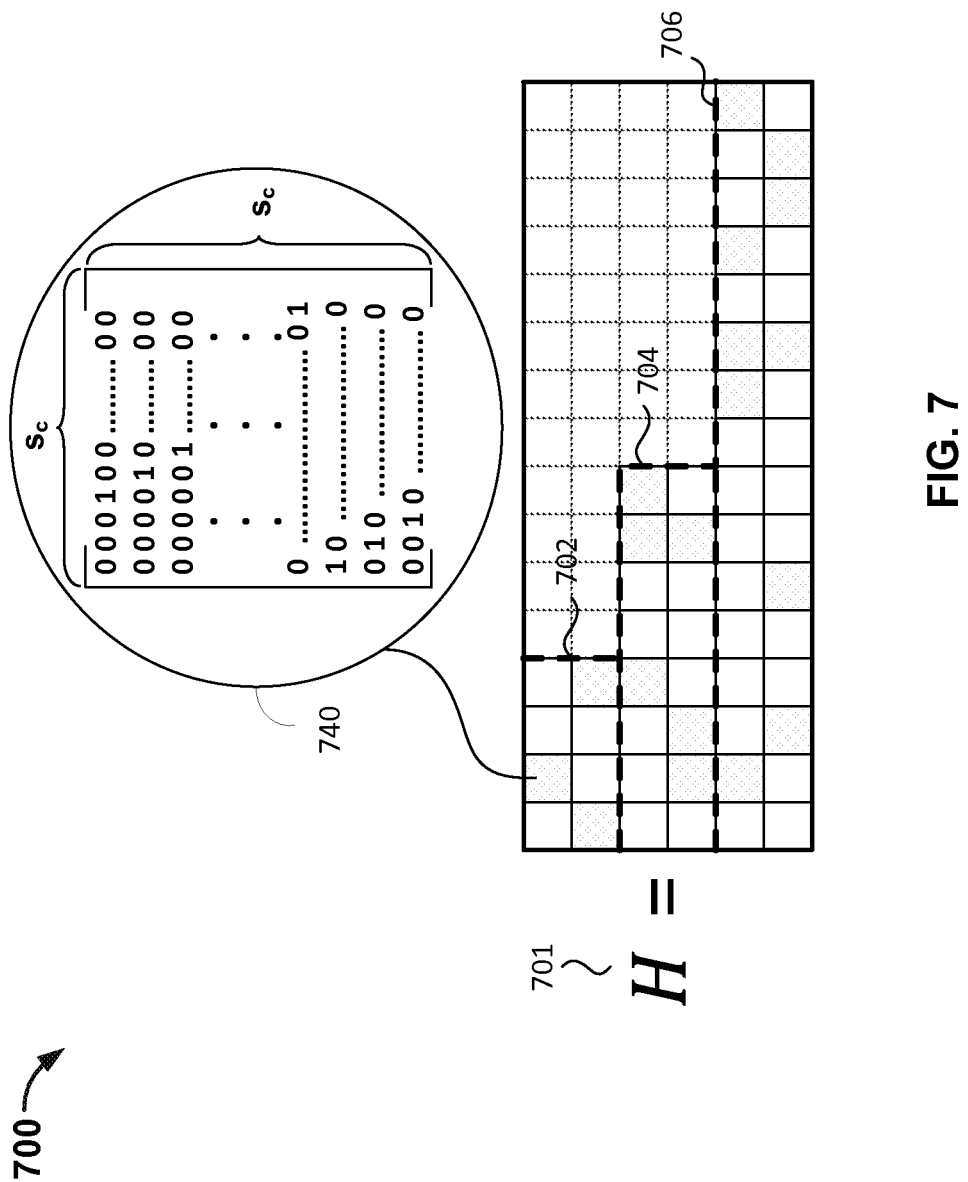
FIG. 7 shows an illustrative example of a Type B cascade LDPC code with quasi-cyclic structure, in accordance with some embodiments of the present disclosure.

For example, FIG. 7 shows an illustrative example of a Type B cascade LDPC code 700 with quasi-cyclic structure, in accordance with some embodiments of the present disclosure. LDPC code 700 may be associated with a parity check matrix 701 that consists of a number of circular submatrices known as "circulants." These circulants, such as circulant 740, are illustrated as shaded blocks in FIG. 7. Blocks that are not shaded may correspond to block matrices with all-zero elements that have the same size as the other circulants. Circulant 740 is a square matrix, i.e., circulant 740 has an equal number of rows and columns. This number is commonly referred to as the circulant size $S_c$. In addition, circulants have the property that for any given positive integer $C_{i,j} < S_c$, any row/column of the circulant matrix may be cyclically shifted by $C_{i,j}$ positions to obtain another row/column.

If a quasi-cyclic representation of parity check matrix is used, then the implementation of LDPC encoder 104 and of LDPC decoder 116, may be significantly simplified. One reason for this is that parity check matrix 701 may be much easier to store, since only the first row/column of each circulant matrix needs to be stored in order to generate the entire circulant. If the circulant is sparse (has low row/column weight) then it may be stored by simply storing the positions of the one-bits in its first row (or first column). Furthermore by using a quasi-cyclic representation of parity check matrix, the storage of the messages used during the decoding of a LDPC vector within LDPC decoders may also be made more compact and parallelization in the encoder/decoder may be achievable with simple shifting operations, since adjacent rows (or adjacent columns) corresponding to the same circulant are cyclic shifts of each other. In addition, for some quasi-cyclic LDPC codes, encoding and decoding can be further simplified by efficient address-generation.

In some embodiments, the parity check matrix of a cascade LPDC code (e.g., parity check matrix 201, 301, or 401) may also be quasi-cyclic. For example, as is illustrated in relation to FIG. 7, submatrix 702 may correspond to block matrix 302, submatrix 704 may correspond to block matrix 304, and submatrix 708 may correspond to block matrix 308. Each of submatrices 702-708 may be composed of a number of circulants 740. For example, block matrix 702 may consist of 2×4 circulants, block matrix 704 may consist of 2×8 circulants, and block matrix 706 may consist of 2×16 cirulcants.

Figure 8:
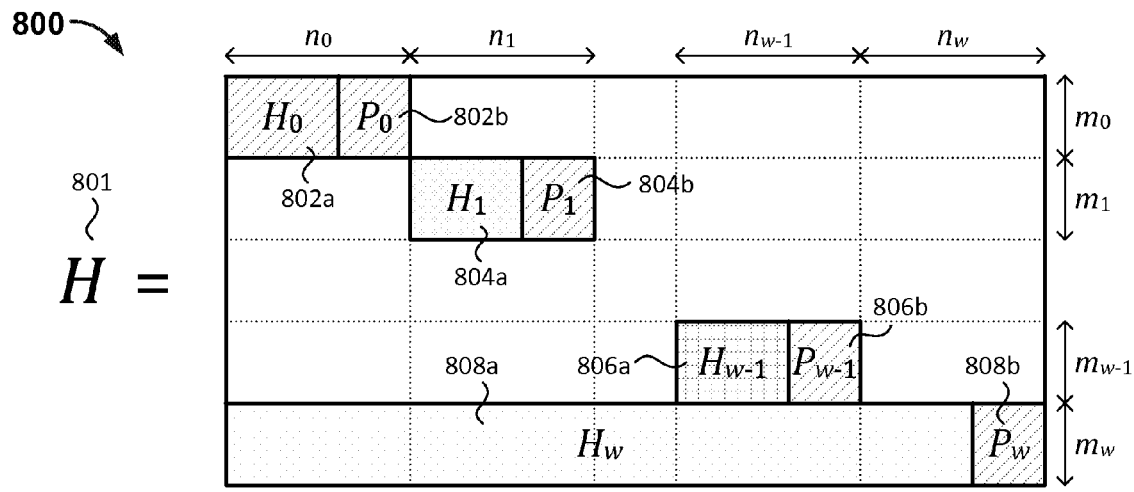
FIG. 8 shows an illustrative parity check matrix in which data and parity portions are arranged in blocks, in accordance with some embodiments of the present disclosure.

FIG. 8 shows an illustrative parity check matrix 800 in which data and parity portions are arranged in blocks, in accordance with some embodiments of the present disclosure. Parity check matrix 800 may consist of a number of block matrices 802-804, similar to the parity check matrices discussed in relation to FIGS. 2-5. In some aspects, block matrices 802-806, which make up a cascade LDPC code's parity check matrix, may be structured such that a data portion is associated with lower numbered columns than a corresponding parity portion. For example, a first number of columns of block matrix 802 may correspond to data portion 802a of block matrix 802. In contrast, a second number of columns, appearing last in block matrix 802, may correspond to a parity portion 802b of block matrix 802. In some implementations, arranging the data and parity portions of each of block matrices 802-806 in this way may be favorable from a complexity perspective, because during each of the stages of the decoding process (e.g., decoding stages 608 and 610 discussed in relation to FIG. 6) data and parity portions may easily be distinguished, which may allow for decoder implementations with reduced complexity.

Figure 9:
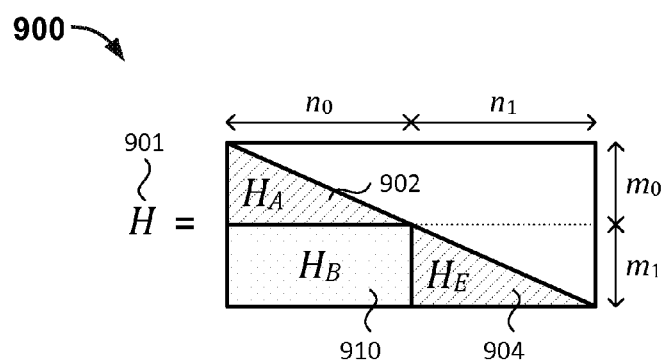
FIG. 9 shows an illustrative example of a parity check matrix with encoding structure constraints, in accordance with some embodiments of the present disclosure.

FIG. 9 shows an illustrative example of a parity check matrix 900 with encoding structure constraints, in accordance with some embodiments of the present disclosure. Parity check matrix 900 may include a number of block matrices, such as block matrices 902-910. In some embodiments, some of block matrices 902-910, such as block matrices 902, 904, and 910, may have a first set of matrix structure constraints, such as being lower triangular. Other block matrices, such as block matrices 906 and 908, may have other constraints or no specific constraints. In some implementations (not shown), block matrices 902-910 may all share the same structural constraints. The number of structure constraints may not need to be limited to two, as discussed in foregoing example, but could be any suitable number.

Figure 10:
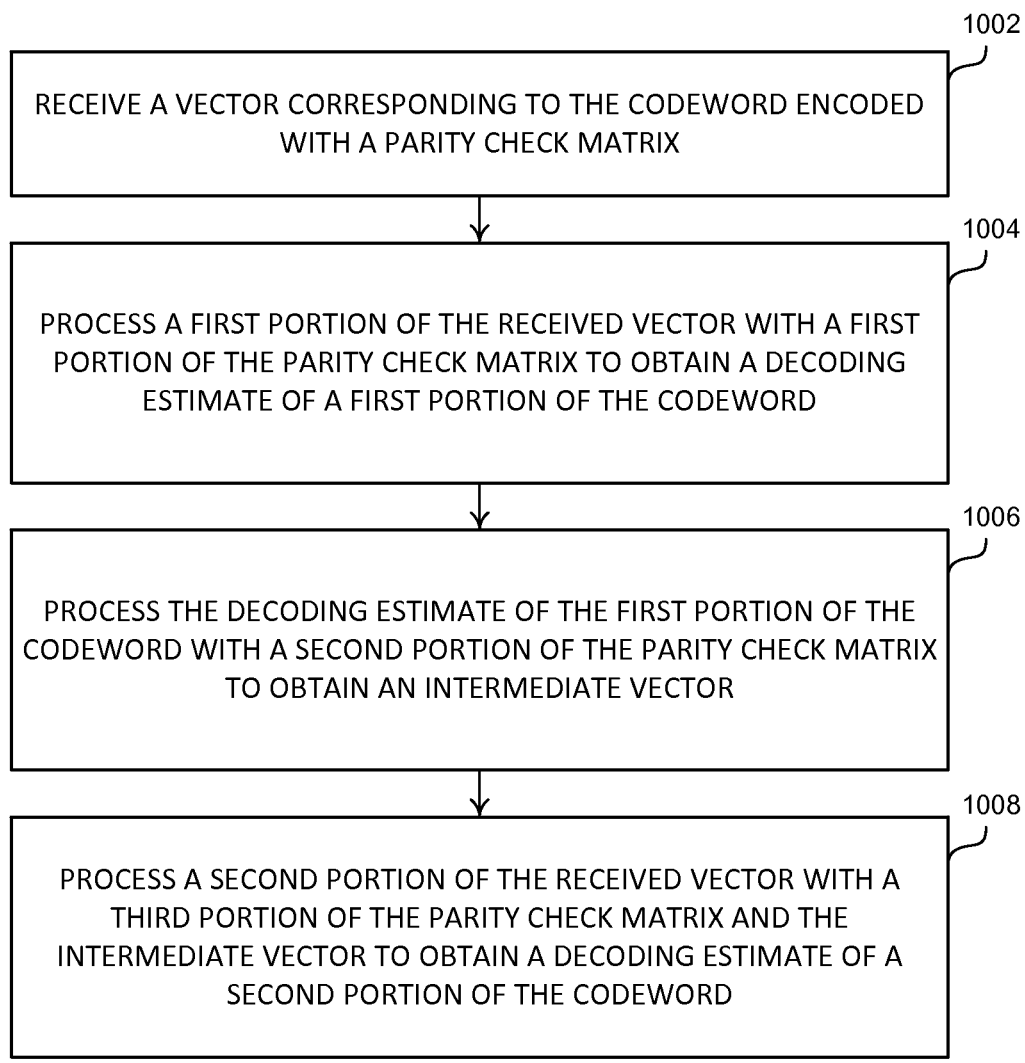
FIG. 10 shows a high-level flow chart of a process for decoding a codeword associated with a cascade LDPC code, in accordance with some embodiments of the present disclosure.

FIG. 10 shows a high-level flow chart of a process 1000 for decoding a codeword of a cascade LDPC code, in accordance with some embodiments of the present disclosure. LDPC decoder 108 may execute process 1000 by, at 1002, receiving a vector that corresponds to a transmitted codeword that was encoded with a parity check matrix. At 1004, process 1000 may process a first portion of the received vector with a first portion of the parity check matrix to obtain a decoding estimate of a first portion of the transmitted codeword. Process 1000 may further, at 1006, process the decoding estimate of the first portion of the transmitted codeword with a second portion of the parity check matrix to obtain an intermediate vector. At 1008, process 1008 may process a second portion of the received vector with a third portion of the parity check matrix and the intermediate vector to obtain a decoding estimate of a second portion of the transmitted codeword.

At 1002, LDPC decoder 108 may receive a vector associated with an LPDC code. In some aspects, the LDPC code may corresponds to a cascade LDPC code of Type A, Type B, or Type C. Accordingly, the LDPC code may be associated with a parity check matrix that has a block matrix structure similar to parity check matrix 201, 301, or 401, as discussed in relation to FIGS. 2-4. As is described in relation to FIG. 1, the received vector may be received from a demodulator, such as demodulator 116. The received vector may be corrupted due to interference, noise, or other physical phenomena associated with transmission channel 110. The received vector may correspond to a codeword that includes a data and a parity portion.

At 1004, process 1000 may process a first portion of the received vector with a first portion of the parity check matrix to obtain a decoding estimate of the first portion of the transmitted codeword. For example, in some embodiments, process 1000 may first partition the received vector into a first portion and a second portion in accordance with the dimensions of the block matrices in the parity check matrix. Process 1000 may then process the first portion of the received vector with a first portion of the parity check matrix (e.g., block matrix $H_A$) to obtain a decoding estimate of the first portion of the transmitted codeword. In some aspects, process 1000 performs processing 604, as discussed in relation to FIG. 6, at 1004. Further, as is discussed in relation to FIG. 6, process 1000 may utilize LDPC decoding schemes, coset decoding schemes, or any other suitable type of decoding scheme to find the decoding estimate of the first portion of the transmitted codeword. In some aspects, process 1000 may not be able to find a decoding estimate that satisfies equation (3), and may instead find an estimate that satisfies the condition specified at 604 of FIG. 6. Process 1000 may store or buffer the decoding estimate of the first portion of the transmitted codeword in order to make the decoding estimate available to later steps of process 1000.

At 1006, process 1000 may process the decoding estimate of the first portion of the transmitted codeword with a second portion of the parity check matrix to obtain an intermediate vector. For example, in some embodiments, process 1000 may multiply the decoding estimate of the first portion of the transmitted codeword with block matrix $H_B$ (element 510) of FIG. 5. Process 1000 may store of buffer the resulting intermediate vector in order to make it available to later stages of the decoding process illustrated by process 1000. In this example, the intermediate vector is the coset syndrome vector to be used at 1008. In some aspects, process 1000 may perform processing 608, as discussed in relation to FIG. 6, at 1006.

At 1008, process 1000 may process a second portion of the received vector with a third portion of the parity check matrix and the intermediate vector to obtain a decoding estimate of a second portion of the received vector. For example, in some embodiments, process 1000 may use block matrix $H_E$ (element 504) in FIG. 5 and the intermediate vector to obtain a decoding estimate of the second portion of the transmitted codeword. Process 1000 may use LDPC decoding techniques, coset decoding techniques, or any other suitable form of decoding techniques to obtain the decoding estimate. The decoding estimate of the second portion of the transmitted codeword may be buffered or stored for use in later stages of process 1000. For example, in some implementations, process 1000 may be an iterative process that repeats processing 1004, 1006, and 1008 for several times in order to refine the decoding estimate of the transmitted codeword. Process 1000 may further combine the decoding estimate of the first portion of the transmitted codeword with the second portion of the transmitted codeword to obtain a decoding estimate of the entire transmitted codeword. In some aspects, process 1000 may perform processing 610, as discussed in relation to FIG. 6, at 1008.

Figure 11:
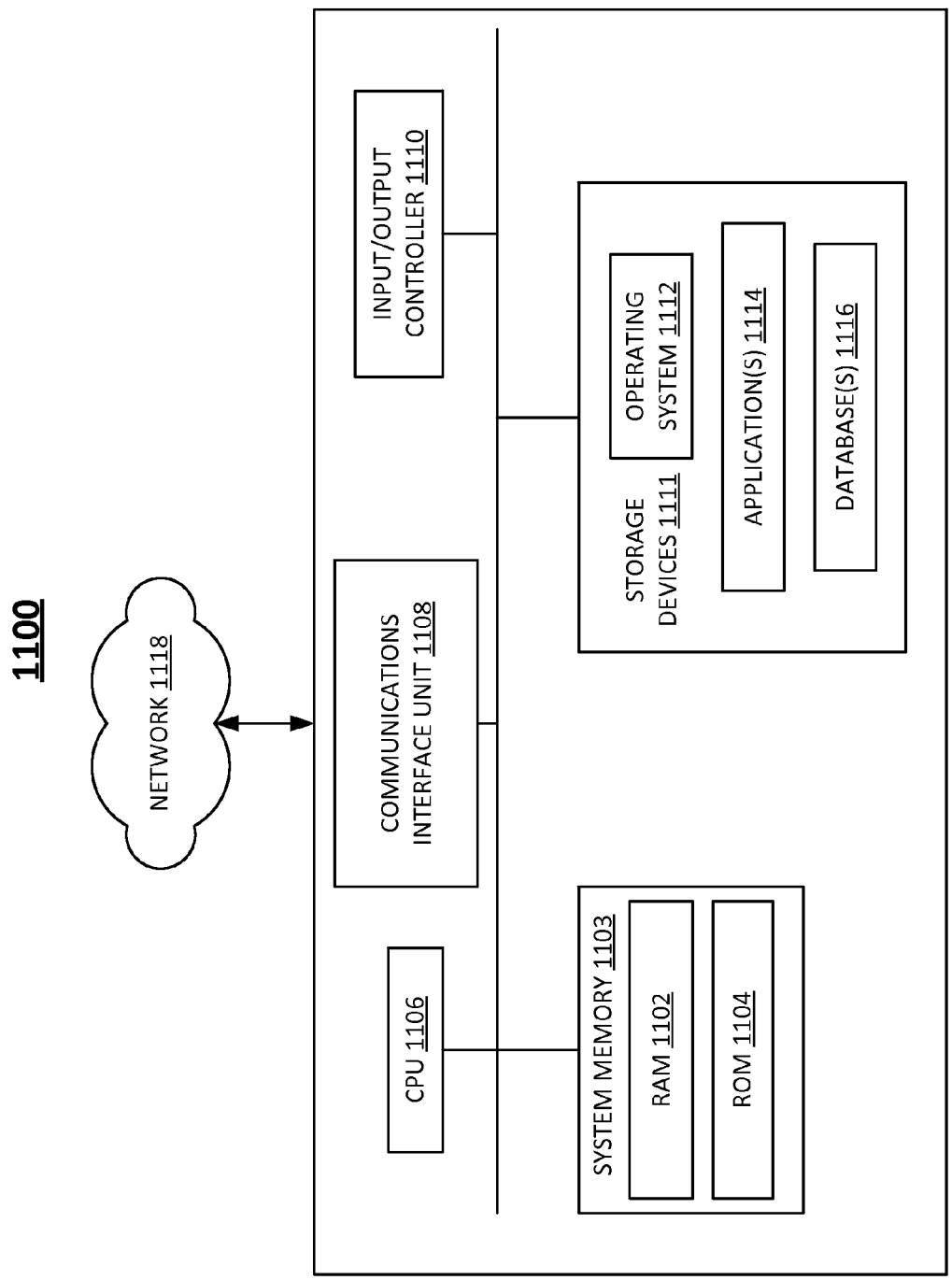
FIG. 11 shows a block diagram of a computing device, for performing any of the processes described herein, in accordance with an embodiment of the present disclosure.

FIG. 11 is a block diagram 1100 of a computing device, such as any of the user equipment devices of FIG. 1, for performing any of the processes described herein, in accordance with an embodiment of the disclosure. Each of the components of these systems may be implemented on one or more computing devices 1100. In certain aspects, a plurality of the components of these systems may be included within one computing device 1100. In certain embodiments, a component and a storage device 1111 may be implemented across several computing devices 1100.

The computing device 1100 comprises at least one communications interface unit 1108, an input/output controller 1110, system memory 1103, and one or more data storage devices 1111. The system memory 1103 includes at least one random access memory (RAM 1102) and at least one read-only memory (ROM 1104). All of these elements are in communication with a central processing unit (CPU 1106) to facilitate the operation of the computing device 1100. The computing device 1100 may be configured in many different ways. For example, the computing device 1100 may be a conventional standalone computer, or, alternatively, the functions of computing device 1100 may be distributed across multiple computer systems and architectures. In FIG. 11, the computing device 1100 is linked, via network 1118 or local network, to other servers or systems.

The computing device 1100 may be configured in a distributed architecture, wherein databases and processors are housed in separate units or locations. Some units perform primary processing functions and contain at a minimum a general controller or a processor and a system memory 1103. In distributed architecture embodiments, each of these units may be attached via the communications interface unit 1108 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to Ethernet, SAP, SAS™, ATP, BLUETOOTH™, GSM and TCP/IP.

The CPU 1106 comprises a processor, such as one or more conventional microprocessors and one or more supplementary co-processors such as math co-processors for offloading workload from the CPU 1106. The CPU 1106 is in communication with the communications interface unit 1108 and the input/output controller 1110, through which the CPU 1106 communicates with other devices such as other servers, user terminals, or devices. The communications interface unit 1108 and the input/output controller 1110 may include multiple communication channels for simultaneous communication with, for example, other processors, servers or client terminals.

The CPU 1106 is also in communication with the data storage device 1111. The data storage device 1111 may comprise an appropriate combination of magnetic, optical or semiconductor memory, and may include, for example, RAM 1102, ROM 1104, flash drive, an optical disc such as a compact disc or a hard disk or drive. The CPU 1106 and the data storage device 1111 each may be, for example, located entirely within a single computer or other computing device, or connected to each other by a communication medium, such as a USB port, serial port cable, a coaxial cable, an Ethernet cable, a telephone line, a radio frequency transceiver or other similar wireless or wired medium or combination of the foregoing. For example, the CPU 1106 may be connected to the data storage device 1111 via the communications interface unit 1108. The CPU 1106 may be configured to perform one or more particular processing functions.

The data storage device 1111 may store, for example, (i) an operating system 1112 for the computing device 1100; (ii) one or more applications 1114 (e.g., a computer program code or a computer program product) adapted to direct the CPU 1106 in accordance with the systems and methods described here, and particularly in accordance with the processes described in detail with regard to the CPU 1106; or (iii) database(s) 1116 adapted to store information that may be utilized to store information required by the program.

The operating system 1112 and applications 1114 may be stored, for example, in a compressed, an uncompiled and an encrypted format, and may include computer program code. The instructions of the program may be read into a main memory of the processor from a computer-readable medium other than the data storage device 1111, such as from the ROM 1104 or from the RAM 1102. While execution of sequences of instructions in the program causes the CPU 1106 to perform the process steps described herein, hard-wired circuitry may be used in place of, or in combination with, software instructions for embodiment of the processes of the present disclosure. Thus, the systems and methods described are not limited to any specific combination of hardware and software.

Suitable computer program code may be provided for performing one or more functions in relation to synchronization signal acquisition as described herein. The program also may include program elements such as an operating system 1112, a database management system and "device drivers" that allow the processor to interface with computer peripheral devices (e.g., a video display, a keyboard, a computer mouse, etc.) via the input/output controller 1110.

The term "computer-readable medium" as used herein refers to any non-transitory medium that provides or participates in providing instructions to the processor of the computing device 1100 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, a hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer may read.

Various forms of computer-readable media may be involved in carrying one or more sequences of one or more instructions to the CPU 1106 (or any other processor of a device described herein) for execution. For example, the instructions may initially be borne on a magnetic disk of a remote computer (not shown). The remote computer may load the instructions into its dynamic memory and send the instructions over an Ethernet connection, cable line, or even telephone line using a modem. A communications device local to a computing device 1100 (e.g., a server) may receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only by the claims which follow.

What is claimed is:

1. A method for decoding a codeword of a low density parity check (LDPC) code, the method comprising:
   receiving, using control circuitry, a vector corresponding to the codeword encoded with a parity check matrix;
   decoding a first portion of the received vector with a first portion of the parity check matrix to obtain a decoding estimate of a first portion of the codeword;
   decoding a second portion of the received vector with a second portion of the parity check matrix to obtain a decoding estimate of a second portion of the codeword, wherein the decoding of the second portion of the received vector is independent of the decoding of the first portion of the received vector; and
   decoding a third portion of the received vector based on a third portion of the parity check matrix and the decoding estimates of the first and the second portions of the codeword to obtain a decoding estimate of a third portion of the codeword.

2. The method of claim 1, further comprising:
   repeating the decoding of the first and the second portions of the received vector until a stopping criterion is satisfied.

3. The method of claim 2, wherein the stopping criterion is satisfied when at least one of the following conditions is met:
   a predetermined number of iterations has been completed,
   a valid codeword has been identified, and
   at least one decoding parameter has a value that is substantially equal to a predetermined value.

4. The method of claim 1, wherein the parity check matrix has a lower triangular block structure.

5. The method of claim 4, wherein:
   the parity check matrix comprises a first matrix and a second matrix on the main diagonal of the parity check matrix and a third matrix below the main diagonal;
   the first matrix corresponds to the first portion of the parity check matrix;
   the second matrix corresponds to the second portion of the parity check matrix; and
   the third portion of the parity check matrix comprises the third matrix below the main diagonal.

6. The method of claim 5, wherein the third portion of the parity check matrix further comprises a fourth matrix on the main diagonal occupying same rows as the third matrix.

7. The method of claim 5, wherein the first matrix and the second matrix have the same size.

8. The method of claim 1, wherein the parity check matrix comprises a plurality of circulants.

9. The method of claim 1, wherein the first portion of the parity check matrix satisfies a first set of constraints, and the second portion of the parity check matrix satisfies a second set of constraints.

10. The method of claim 1, further comprising:
    combining the decoding estimates of the first, the second, and the third portions of the codeword to obtain a decoding estimate of the codeword.

11. A system for decoding a codeword of a low density parity check (LDPC) code, the system comprising:
    a decoding buffer configured to receive a vector corresponding to the codeword encoded with a parity check matrix; and
    control circuitry configured to:
      decode a first portion of the received vector with a first portion of the parity check matrix to obtain a decoding estimate of a first portion of the codeword;
      decode a second portion of the received vector with a second portion of the parity check matrix to obtain a decoding estimate of a second portion of the codeword, wherein the decoding of the second portion of the received vector is independent of the decoding of the first portion of the vector, and
      decode a third portion of the received vector based on a third portion of the parity check matrix and the decoding estimates of the first and the second portions of the codeword to obtain a decoding estimate of the third portion of the codeword.

12. The system of claim 11, wherein the control circuitry is further configured to:
    repeat the decoding of the first and the second portions of the received vector until a stopping criterion is satisfied.

13. The system of claim 12, wherein the stopping criterion is satisfied when at least one of the following conditions is met:
    a predetermined number of iterations has been completed,
    a valid codeword has been identified, and
    at least one decoding parameter has a value that is substantially equal to a predetermined value.

14. The system of claim 11, wherein the parity check matrix has a lower triangular block structure.

15. The system of claim 14, wherein:
    the parity check matrix comprises a first matrix and a second matrix on the main diagonal of the parity check matrix and a third matrix below the main diagonal;
    the first matrix corresponds to the first portion of the parity check matrix;
    the second matrix corresponds to the second portion of the parity check matrix; and the third portion of the parity check matrix comprises the third matrix below the main diagonal.

16. The system of claim 15, wherein the third portion of the parity check matrix further comprises:
a fourth matrix on the main diagonal occupying the same rows as the third matrix.

17. The system of claim 15, wherein the first matrix and the second matrix have the same size.

18. The system of claim 11, wherein the parity check matrix comprises a plurality of circulants.

19. The system of claim 11, wherein the first portion of the parity check matrix satisfies a first set of constraints, and the second portion of the parity check matrix satisfies a second set of constraints.

20. The system of claim 11, wherein the control circuitry is further configured to:
combine the decoding estimates of the first, the second, and the third portions of the codeword to obtain a decoding estimate of the codeword.

* * * * *